United States Patent
Taniyama et al.

(10) Patent No.: US 6,923,867 B2
(45) Date of Patent: Aug. 2, 2005

(54) SUBSTRATE PROCESSING APPARATUS AND METHOD FOR MANUFACTURING SEMICONDUCTOR DEVICE

(75) Inventors: Tomoshi Taniyama, Tokyo (JP); Kouji Tometsuka, Tokyo (JP); Shusaku Yanagawa, Tokyo (JP)

(73) Assignees: Hitachi Kokusai Electric Inc., Tokyo (JP); Sony Corporation, Tokyo (JP)

( * ) Notice: Subject to any disclaimer, the term of this patent is extended or adjusted under 35 U.S.C. 154(b) by 0 days.

(21) Appl. No.: 10/190,516

(22) Filed: Jul. 9, 2002

(65) Prior Publication Data

US 2003/0017714 A1 Jan. 23, 2003

(30) Foreign Application Priority Data

Jul. 12, 2001 (JP) ........................................ 2001-211952

(51) Int. Cl.[7] .............................................. C23C 16/00
(52) U.S. Cl. ........................ 118/719; 118/724; 118/725; 118/726
(58) Field of Search ................................. 118/725, 724, 118/719, 726; 117/99, 84, 100, 109

(56) References Cited

U.S. PATENT DOCUMENTS

| | | | | |
|---|---|---|---|---|
| 3,007,819 A | * | 11/1961 | McNamara | 438/471 |
| 3,572,672 A | * | 3/1971 | Harel | 432/156 |
| 3,675,619 A | * | 7/1972 | Burd | 118/719 |

(Continued)

FOREIGN PATENT DOCUMENTS

| | | | |
|---|---|---|---|
| JP | 54-96360 | * | 7/1979 |
| JP | B2 6-28248 | | 4/1994 |
| WO | WO 02/061170 | * | 8/2002 |

OTHER PUBLICATIONS

Webster's Third New international Dictionary, Meriam–Webster, 1993, p. 2548.*

*Primary Examiner*—Richard Bueker
(74) *Attorney, Agent, or Firm*—Oliff & Berridge, PLC

(57) ABSTRACT

A substrate processing apparatus and a method for manufacturing a semiconductor device can supply the vapor of the raw material to the substrate without fail. A main heater 22 is prepared outside the outer tube 21, an inner tube 23 is prepared inside the outer tube 21, a cap 24 that can be lifted and lowered is inserted in the inner tube 23, a boat 25 is mounted on the cap 24, a raw material sublimation portion 46 and a heat insulating portion 36 are prepared on the cap 24, a heater portion 45 is set up with possible attachment and detachment on the cap 24, a sublimation heater 26 of the heater portion 45 is located inside the reaction chamber, a raw material loading board 34 of the raw material sublimation portion 46 is prepared on the upper portion of the sublimation heater 26, a plurality of pole members 35 are prepared around the raw material loading board 34, the heat insulation portion 36 is supported by the pole member 35, and the heat insulating portion 36 is located between the raw material sublimation portion 46 and the substrate processing area, and the heat insulating portion 36 is packed with a quartz wool.

10 Claims, 8 Drawing Sheets

21 : OUTER TUBE
22 : MAIN HEATER
23 : CYLINDRICAL INNER TUBE
25 : BOAT
36 : HEAT INSULATION PORTION
46 : RAW MATERIAL SUBLIMATION PORTION

U.S. PATENT DOCUMENTS

| | | | |
|---|---|---|---|
| 3,690,290 A | * 9/1972 | Jarvela et al. | 118/730 |
| 3,858,548 A | * 1/1975 | Tick | 118/724 |
| 4,100,879 A | * 7/1978 | Goldin et al. | 118/725 |
| 4,154,631 A | * 5/1979 | Schoolar | 117/105 |
| 4,226,208 A | * 10/1980 | Nishida et al. | 118/706 |
| 4,227,948 A | 10/1980 | Jensen et al. | |
| 4,264,803 A | * 4/1981 | Shinko | 392/389 |
| 4,330,932 A | 5/1982 | Morris et al. | |
| 4,668,480 A | * 5/1987 | Fujiyashu et al. | 118/719 |
| 5,133,286 A | * 7/1992 | Choo et al. | 118/725 |
| 5,168,543 A | * 12/1992 | Murray | 392/388 |
| 5,343,022 A | * 8/1994 | Gilbert et al. | 219/552 |
| 5,556,472 A | * 9/1996 | Nakamura et al. | 118/719 |
| 5,827,371 A | * 10/1998 | Colombo et al. | 118/726 |
| 6,296,894 B1 | * 10/2001 | Tanabe et al. | 427/8 |
| 6,473,564 B1 | * 10/2002 | Nagashima et al. | 392/389 |
| 2001/0008121 A1 | * 7/2001 | Tanabe | 118/663 |
| 2002/0182307 A1 | * 12/2002 | Lee et al. | 427/66 |
| 2003/0026601 A1 | * 2/2003 | Jabbour | 392/389 |

* cited by examiner

21 : OUTER TUBE
22 : MAIN HEATER
23 : CYLINDRICAL INNER TUBE
25 : BOAT
36 : HEAT INSULATION PORTION
46 : RAW MATERIAL SUBLIMATION PORTION

21 : OUTER TUBE
22 : MAIN HEATER
23 : CYLINDRICAL INNER TUBE
25 : BOAT
26 : SUBLIMATION HEATER
34 : RAW MATERIAL LOADING BOARD
36 : HEAT INSULATION PORTION
46 : RAW MATERIAL SUBLIMATION PORTION

26 : SUBLIMATION HEATER

34 : RAW MATERIAL LOADING BOARD
36 : HEAT INSULATION PORTION
46 : RAW MATERIAL SUBLIMATION PORTION (a)

(b)

SUBSTRATE PROCESSING APPARATUS AND METHOD FOR MANUFACTURING SEMICONDUCTOR DEVICE

BACKGROUND OF THE INVENTION

1. Field of the Invention

This invention relates to a substrate processing apparatus supplying a raw material such as antimony oxide (Sb2O3) etc. in a sublimated state to a substrate such as a semiconductor substrate, and a manufacturing method of a semiconductor device.

2. Description of the Related Art

FIG. 7 is a schematic sectional view of a conventional processing apparatus of a substrate. As shown in the Figure, a heater 2 is prepared outside the outer tube 1, an inner tube 3 is prepared inside the outer tube 1, a cap 4 that can be lifted and lowered is inserted in the inner tube 3, a boat 5 is mounted on the cap 4, and a plurality of semiconductor substrates (not shown in the figure) are supported on the boat 5. A raw material sublimating apparatus 6 is prepared outside the outer tube 1 and the inner tube 3, that is outside the reactor, one end of a raw material introducing tube 7 is connected to the raw material sublimating apparatus, the other end of the raw material introducing tube 7 is located in the upper portion of the inner tube 3, and the raw material introducing tube 7 is communicating with the inside of the inner tube 3. An exhaust tube 8 is prepared in the lower portion of the inner tube 3.

In this substrate processing apparatus, when antimony oxide is put in the raw material sublimating apparatus 6 and heated, while the semiconductor substrate supported on the boat 5 is heated by the heater 2, antimony oxide sublimates, the vapor of antimony oxide is supplied through the raw material introducing tube 7 to a surface of the semiconductor substrate, and antimony oxide is diffused into the semiconductor substrate. A exhaust gas is cooled by the cap 4, and exhausted through an exhaust tube 8.

FIG. 8 is a schematic sectional view of the other conventional substrate processing apparatus described in Japanese Patent Application Laid-open HEI06-28248, and FIG. 9 is an enlarged A—A sectional view of FIG. 8. As shown in Figures, a subreactor core tube 12 is connected with the main reactor core tube 11, a main reactor core tube heater 13 is prepared outside the main reactor core tube 11, a subreactor core tube heater 14 is prepared outside the subreactor core tube 12, a soaking tube 15 is prepared between the subreactor core tube 12 and the subreactor core tube heater 14, a semiconductor substrate 16 is mounted inside the main reactor core tube 11, and an impurity boat 17 is prepared inside the subreactor core tube 12.

In this substrate processing apparatus, when antimony oxide powder is heated by the subreactor core tube heater 14 after mounting antimony oxide powder on the impurity boat 17, while heating the semiconductor substrate 16 by the main reactor core tube heater 11, antimony oxide is sublimated, the vapor of antimony oxide is supplied to a surface of the semiconductor substrate 16, and antimony oxide is diffused into the semiconductor substrate 16.

In the substrate processing apparatus shown in FIG. 7, however, the raw material introducing tube 7 is connected with the raw material sublimation tube 6 via a sealant such as an O-ring in order to maintain the airtightness of the connecting portion, however, by no means the temperature in the vicinity of the successive portion is lower than the sublimating temperature of the raw material, since the circumference of the O-ring is cooled due to the low heat-resistance of the O-ring (usually, approximately 100 to 300° C.). As a result the temperature of the connecting portion becomes low, and antimony oxide re-solidifies at this portion and attaches to the inner surface of the inner tube as reaction products. Thus cases may arise in which the vapor of antimony oxide cannot be supplied to the surface of the semiconductor device.

In the substrate processing apparatus shown in FIGS. 8 and 9, the raw material antimony oxide is heated and sublimated by the subreactor core tube heater 14 placed outside the subreactor core tube 12, however, there is a possibility that the control of sublimation becomes poor, because the raw material and the heater 14 are prepared in a separate manner as a result of the heater 14 being placed outside the reactor, and because a multiplicity of interventions such as the subreactor core tube 12 and the soaking tube 15 placed between the raw material and the heater 14 influence the temperature.

In the conventional apparatus shown in FIGS. 8 and 9, which is a so-called horizontal type apparatus, in which a rector core tube is located in the horizontal direction, it is only necessary to consider the plane area of the clean room where the apparatus is installed, even when the main reactor core tube 11 and the subreactor core tube 12 are separated (i.e. even the length of reactor core tube is long) so that the temperature of the reactor is not influenced and as is the case of the conventional apparatus shown in FIG. 7, the main reactor core tube 11 on which the substrate is mounted and the raw material sublimation space can be communicated, even when the connection portion using an O-ring is not prepared. However, in the case of the vertical type apparatus (i.e. the reaction tube is located in the vertical direction) shown in FIG. 7, which is the mainstream of the production line for a semiconductor device, it was not possible to simply increase the length of the reactor core tube in the vertical direction due to the limitation of the height of the clean room where the apparatus is installed.

SUMMARY OF THE INVENTION

The object of the present invention is to provide a substrate processing apparatus and method for manufacturing a semiconductor device that can supply the vapor of the raw material to the substrate without fail by resolving the above problems.

In order to achieve the object of the present invention, a sublimation heater and a raw material sublimation portion on which the raw material is mounted are prepared in a reaction chamber, the sublimation heater is prepared in the vicinity of the raw material sublimation portion, and the raw material is heated and sublimated by the sublimation heater in a substrate processing apparatus having a main heater, in which the substrate in the reaction chamber is heated by the main heater,.

In this case, a heat insulation portion can be prepared between the raw material sublimation portion and the substrate processing area in the reaction chamber.

In this case, the temperature of the sublimation heater can be over the sublimation temperature of the raw material.

In this case, after the temperature of said main heater reaches a temperature at which said substrate is processed, said main heater and sublimation heater can be controlled so that the temperature of said sublimation heater reaches a temperature at which said raw material is sublimated.

In this case, when the temperature of said raw material reaches a temperature at which said raw material is sublimated, said main heater and sublimation heater can be controlled so that the temperature of said substrate reaches a temperature at which said substrate is processed.

In this case, said sublimation heater comprises a base board and a heater element, and a susceptor for preventing metal contamination can be mounted on the upper surface of said base board.

The manufacturing method of a semiconductor device comprises the steps of: heating the substrate by the main heater in the reaction chamber, introducing a carrier gas in the reaction chamber; sublimating the raw material mounted inside the reaction chamber by the sublimation heater prepared in the reaction chamber; and diffusing the sublimated raw material into the substrate.

In this case, a step can be comprised further that said sublimated raw material is supplied to said substrate processing area over a heat insulation portion prepared between the raw material sublimation area and substrate processing area.

In this case, in said sublimation step, the heating temperature of said sublimation heater can be over the sublimation temperature of said raw material.

In this case, in said sublimation step, the heating temperature of said sublimation heater can reach a temperature at which said raw material is sublimated after the temperature of said main heater reaches a temperature at which said substrate is processed.

In this case, at the time when the temperature of said raw material reaches a temperature at which said raw material is sublimated, the temperature of said substrate can reach a temperature at which said substrate is processed

DETAILED DESCRIPTION OF THE PREFERRED EMBODIMENT

Figure 1:
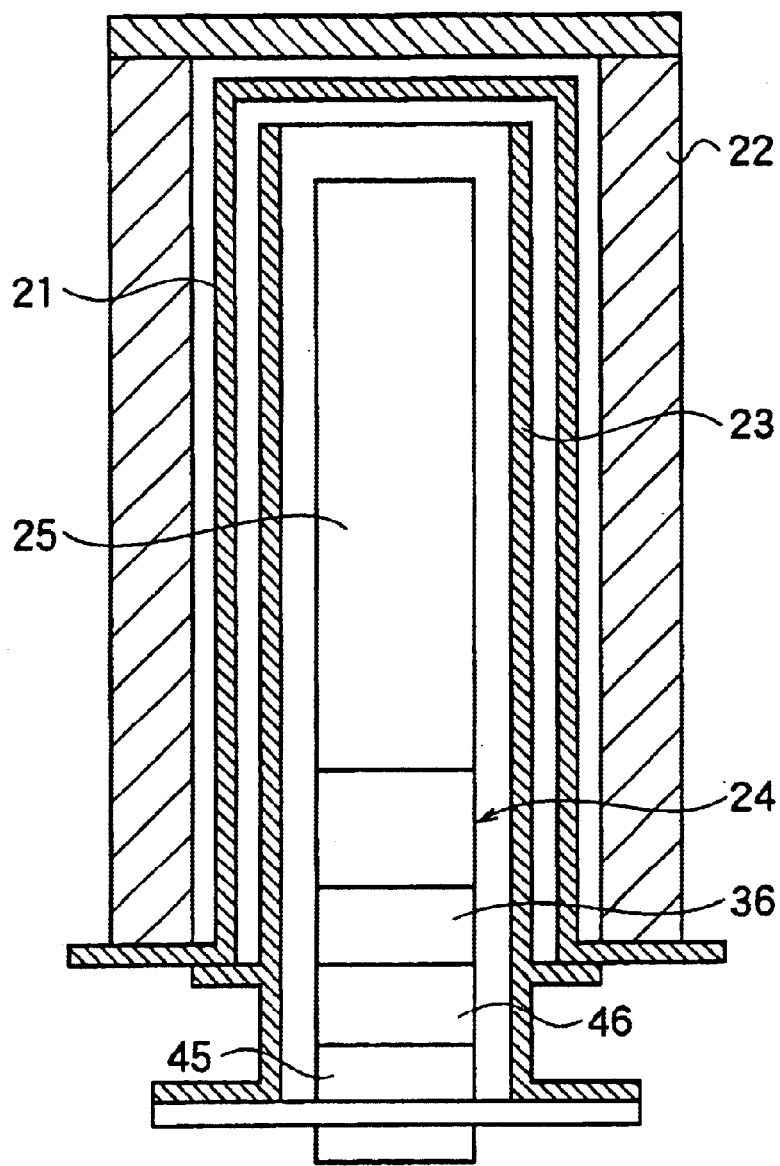
FIG. 1 is a schematic sectional view of the substrate processing apparatus of the present invention.
Figure 2:
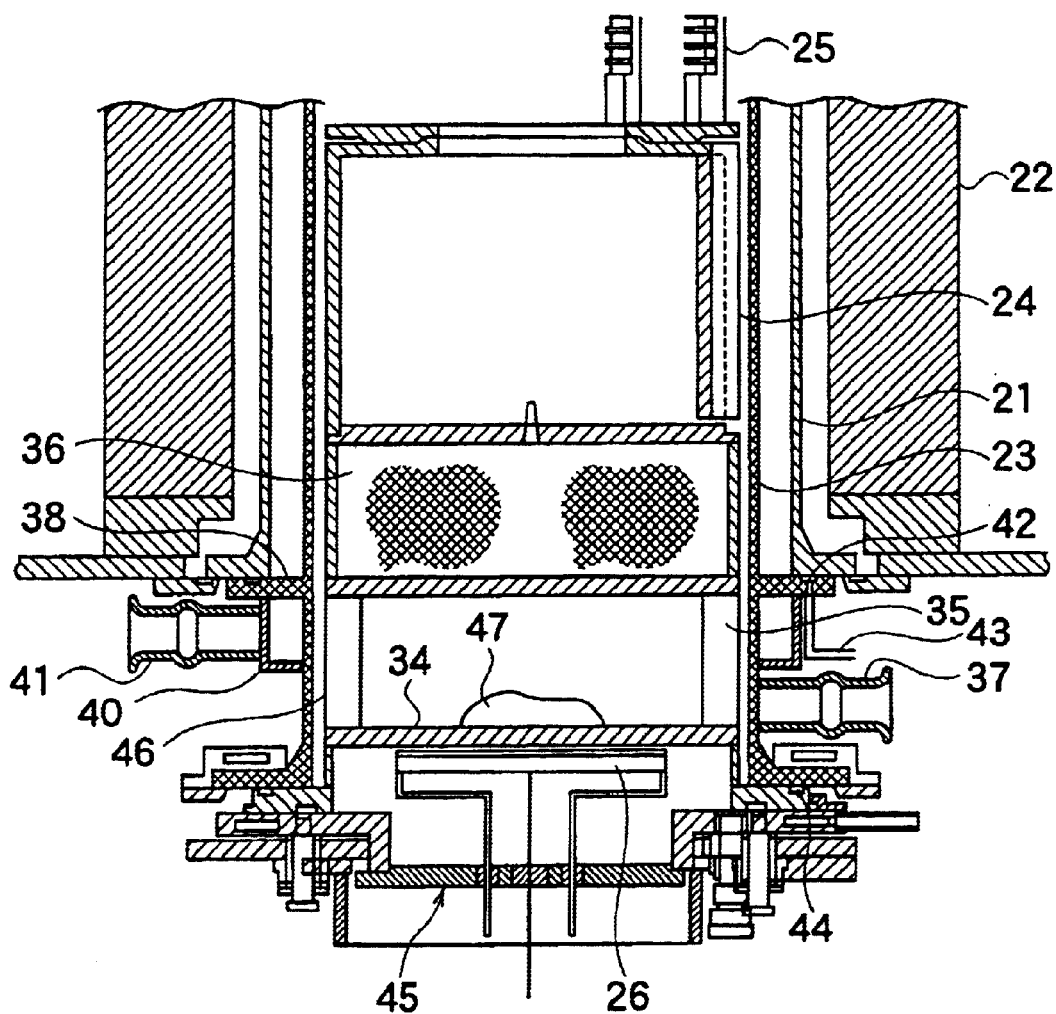
FIG. 2 is a sectional view of a portion of the substrate proessing apparatus shown in FIG. 1.
Figure 3:
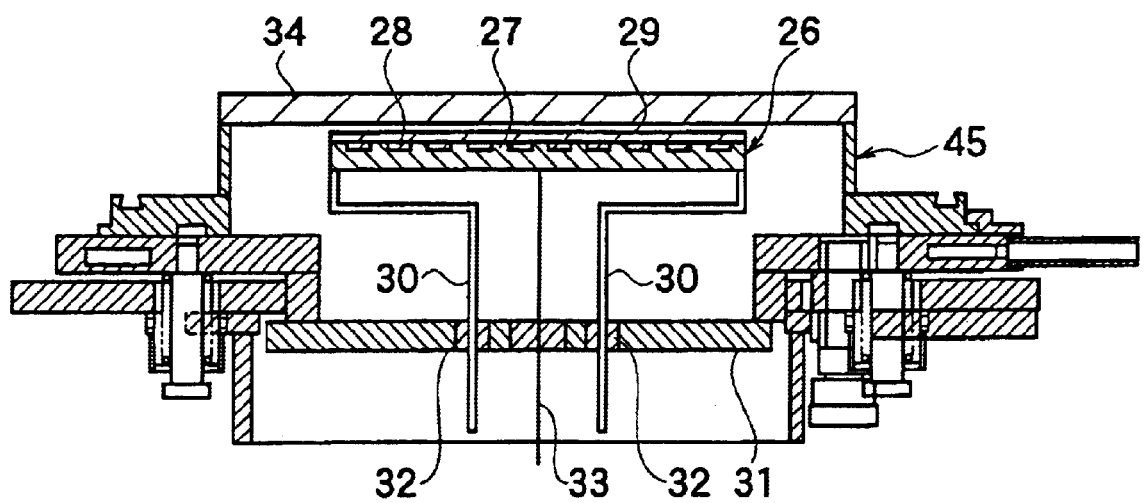
FIG. 3 is a sectional view of a portion of the substrate processing apparatus shown in FIG. 1.
Figure 4:
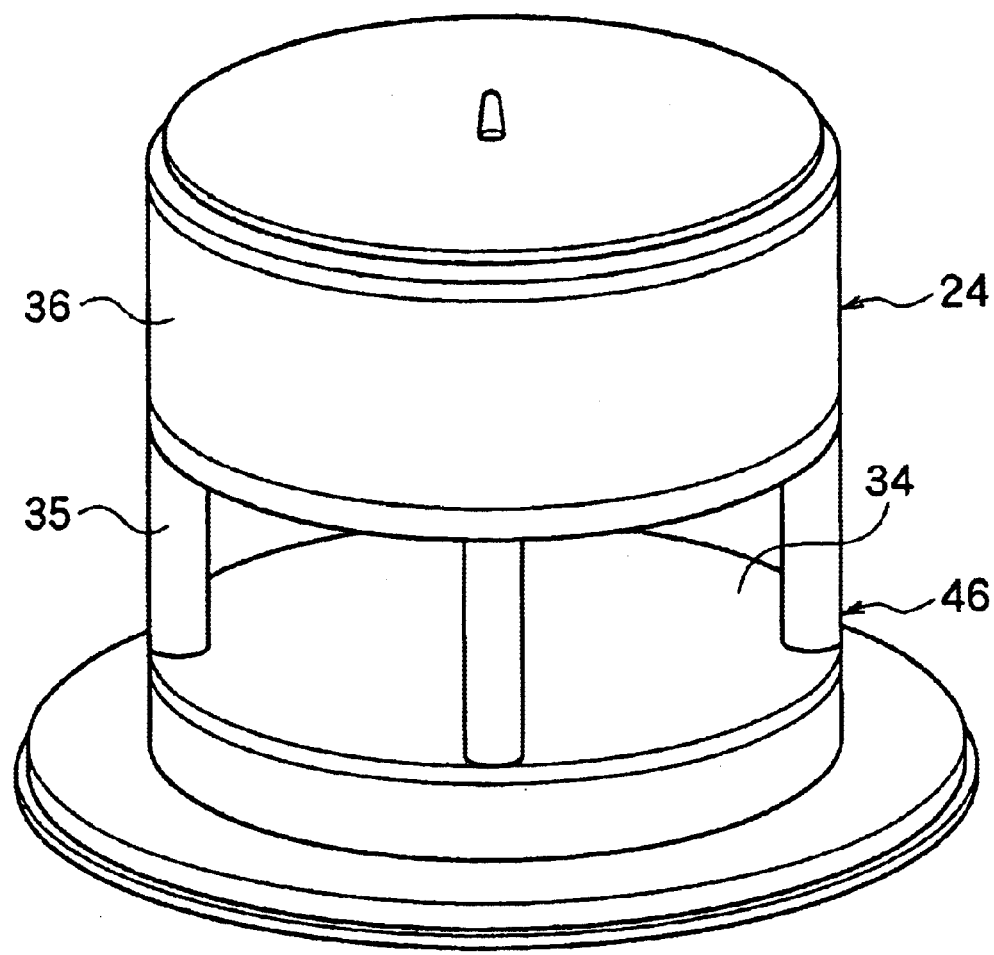
FIG. 4 is a perspective view of a portion of the substrate processing apparatus shown in FIG. 1.
Figure 5:
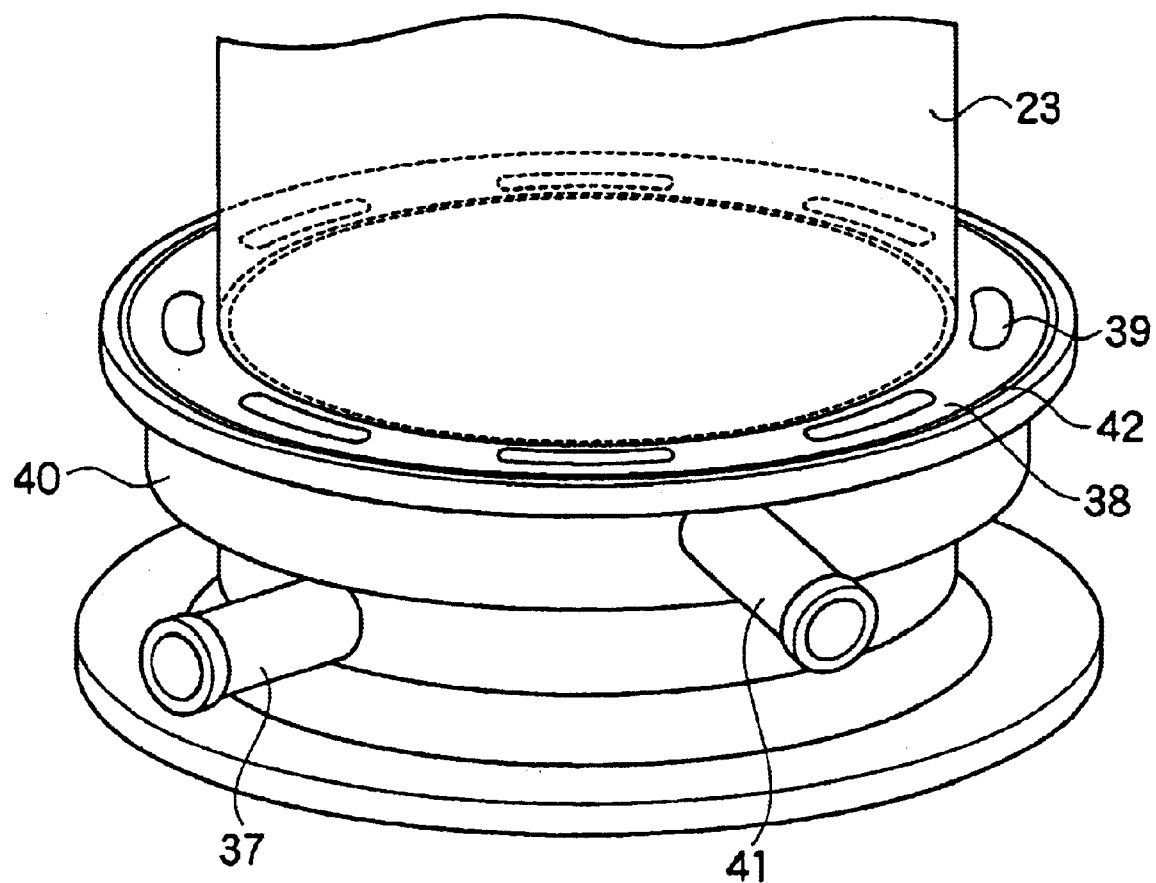
FIG. 5 is a perspective view of a portion of the substrate processing apparatus shown in FIG. 1.

FIG. 1 is a schematic sectional view of the substrate processing apparatus of the present invention. FIG. 2 is a sectional view of a portion of the substrate processing apparatus shown in FIG. 1. FIG. 3 is a sectional view of a portion of the substrate processing apparatus shown in FIG. 1. FIG. 4 is a perspective view of a portion of the substrate processing apparatus shown in FIG. 1. FIG. 5 is a perspective view of a portion of the substrate processing apparatus shown in FIG. 1. As shown in Figures, a main heater 22 is prepared outside the outer tube 21 made of SiC (soaking tube), a cylindrical inner tube (reaction tube) 23 made of quartz is prepared inside the outer tube 21, a cap 24 made of quartz that can be lifted and lowered is inserted in the inner tube 23, a boat 25 is mounted on the cap 24, and a multiplicity of semiconductor substrates (not shown in Figures) are supported on the boat 25. A raw material sublimation portion 46 and a heat insulating portion 36 are prepared on the cap 24, and a heater portion 45 is set up in a manner of possible attachment and detachment. A heater element 28 is prepared on a base board 27 made of a ceramic fiber in the heater portion 45, a sublimation heater 26 consisting of the base board 27 and a heater element 28 is located inside the inner tube 23, that is, inside a reaction chamber. On the upper surface of the base board 27, a susceptor 29 made of SiC is prepared, and a heater terminal 30 connected with the heater element 28 is supported by the connection flange 31 of the heater portion 45 via the insulator 32. Thermo couples 33 are prepared to measure the heating temperature of the sublimation heater 26, and are supported by the connection flange 31. On the upper portion of the sublimation heater 26, a raw material loading board 34 (quartz) of the raw material sublimation portion 46 is prepared, and a multiplicity of pole members 35 (quartz) are prepared. The space over the raw material loading board 34 (i.e. the raw material sublimation space) is communicating with the substrate processing area, that is, the area where the semiconductor substrate inside the inner tube 23 is located. Thus the control of sublimation of the raw material is improved, since the raw material sublimation heater 26 is located in the same space (i.e. inside the reaction chamber) as the raw material, and in the vicinity of the raw material. The heat insulation portion 36 is supported by the pole member 35, and is located between the raw material sublimation portion 46 and the substrate processing area. The heat insulation portion 36 is consisted of a box shaped member made of quartz in which a quartz wool is packed. Although the substrate processing area and the raw material sublimation portion 46 are located inside the inner tube 23, the thermal influence on the raw material sublimation portion 46 can be prevented even when the distance between the substrate processing area and the raw material sublimation portion 46 is not long enough to prevent the influence of the temperature in the substrate processing area, since the heat insulation portion 36 is prepared between the substrate processing area and the raw material sublimation portion 46. Thus the control of sublimation of the raw material is not influenced without making the length of the reaction tube extremely long (or the distance between the substrate processing area and the raw material sublimation portion 46 is short), and a compact apparatus with a suppressed increase in the apparatus height can be realized. A gas introducing tube 37 is connected with the lower portion of the inner tube 23, an exhaust gas slit 39 is prepared on the outer tube loading portion 38 of the inner tube 23, an exhaust gas link 40 is prepared outside the inner tube 23 and in the lower portion of the outer tube loading portion 38, the inside of the inner tube is communicating with the exhaust gas ring 40 via the exhaust gas slit 39, and the exhaust gas tube 40 is connected with the exhaust gas ring 40. A ring groove 42 is prepared on the upper surface of the outer tube loading portion 38, an aperture of a $N_2$ gas introducing tube 43 is prepared at the bottom of the groove 42, and an O-ring 44 is prepared between the inner tube 23 and the cap 24. As explained before, the outer tube 21 is made of SiC in order to give a function required for a soaking tube. However, when there is a temperature gradient, SiC is liable to break, and is also difficult to make processing. Therefore, the outer tube 21 is located in the area surrounded by the main heater 22 (isothermal space). The exhaust gas ring 40 etc. constituting the exhaust heat portion are prepared in the inner tube 23 made of quartz whose processing is easier than SiC.

As the raw material is placed in the lower portion of the inner tube 23 which shares the space with the substrate, the sublimed raw material gas must be flowed to the upward direction from the lower portion of the inner tube 23. However, constituting the inner tube and the outer tube as mentioned above, the gas flow can be realized without causing problems such as breaking.

Then, the operation of the substrate processing apparatus shown in FIGS. 1 to 5, that is, the manufacturing method of the semiconductor device according to the invention, will be explained. The cap 24 on which the boat 25 is mounted is inserted in the inner tube 23, while the raw material antimony oxide powder 47 is mounted on the raw material loading board 34. Subsequently, while heating the semiconductor substrate supported on the boat 25 by the main heater 22 and supplying a carrier gas from the gas introducing tube 37, antimony oxide powder 47 is heated by the sublimation heater 26. Then, antimony oxide sublimates, the vapor of antimony oxide is supplied to the surface of semiconductor substrate, and antimony oxide is diffused onto the surface of the semiconductor substrate. On this occasion, the gas introduced from the gas introducing tube 37 rises up through the inner tube 23, turns at the upper end of the inner tube 23 at an angle of 180 degree, flows through between the inner tube 23 and outer tube 21, and is exhausted from the exhaust tube 41 via the exhaust slit 39 and the exhaust ring 40. When a nitrogen gas is supplied to the groove 42 via the nitrogen introducing tube 43, leakage of the exhaust gas from between the outer tube 21 and inner tube 23 can be prevented.

Figure 6:
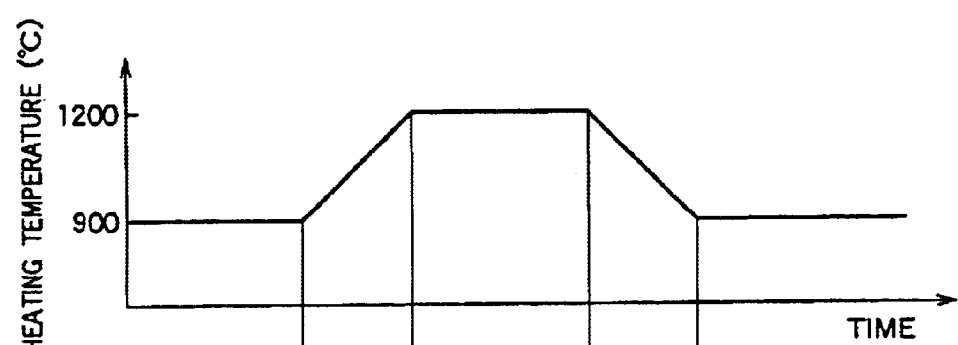
FIG. 6 is a graph showing the change of the heating temperature of the heater when antimony oxide is diffused onto the surface of the semiconductor substrate
Figure 6:
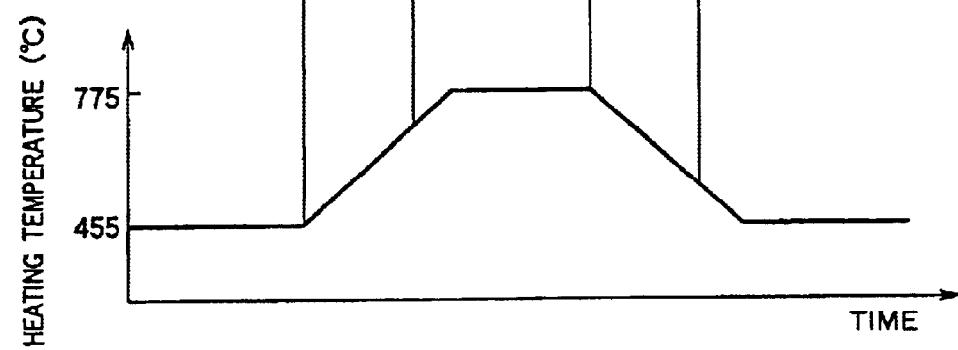
Figure 7:
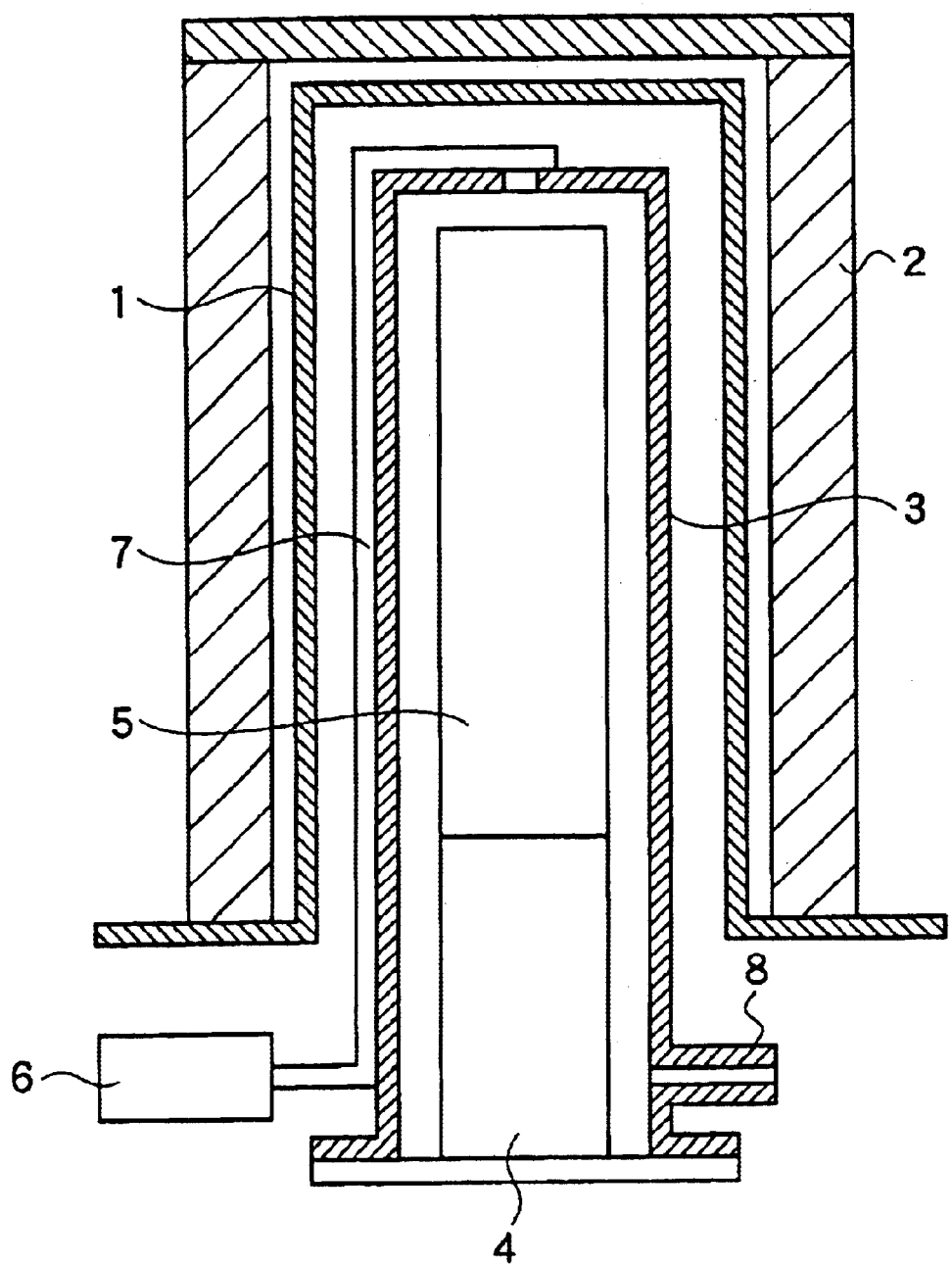
FIG. 7 is a schematic sectional view of a conventional processing apparatus of a substrate.
Figure 8:
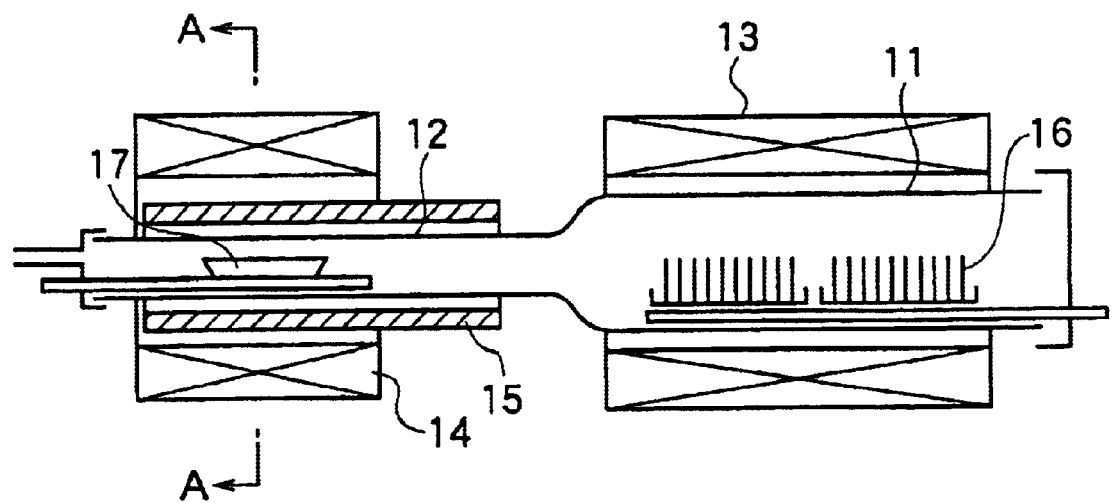
FIG. 8 is a schematic sectional view of the other conventional substrate processing apparatus.
Figure 9:
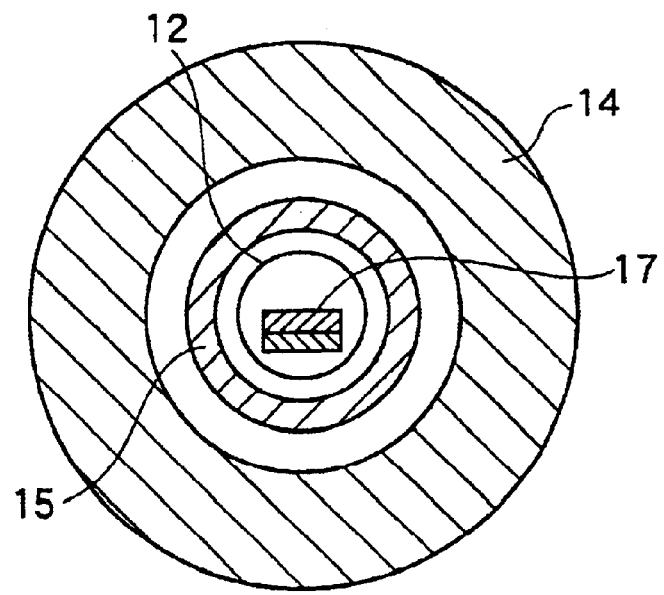
FIG. 9 is an enlarged A—A sectional view of FIG. 8.

FIG. 6 is a graph showing the change of the heating temperature of the heater when antimony oxide is diffused onto the surface of the semiconductor substrate: (a) shows the change of the heating temperature of the main heater 22; (b) shows the change of the heating temperature of the sublimation heater 26. It is clear from the graph that the heating temperature of the sublimation heater 26 is raised to 775° C. after raising the heating temperature of the main heater to 1200° C. by raising the heating temperature of the main heater 22 and the sublimation heater 26 simultaneously from a state in which the heating temperature of the main heater 22 and the sublimation heater 26 becomes 900° C. and 455° C., respectively. The heating temperature of the main heater 22 should be 1200° C. when the heating temperature of the sublimation heater 26 reaches 656° C., the sublimation temperature of antimony oxide. That is if the temperature of the semiconductor substrate reaches the diffusion temperature (processing temperature) at the time when the temperature of the raw material reaches 656° C., processing with an excellent quality of a membrane becomes possible. On the other hand, if the temperature of the semiconductor substrate does not teach the diffusion temperature, although sublimation of the raw material has initiated, a diffusion processing cannot be successfully performed. The heating temperature of the sublimation heater 26 is to be returned to 455° C. after the heating temperature of the main heater 22 returns to 900° C. by lowering the heating temperature of the main heater 22 and the sublimation heater 26 simultaneously after keeping the heating temperature of the main heater 22 at 1200° C. for 45 minutes and the heating temperature of the sublimation heater at 775° C. for 25 minutes. On this occasion when the heating temperature of the main heater 22 is kept at 1200° C., an argon gas is to be supplied through the gas introducing tube 37 at a flow rate of 2 L/min, and on other occasions a nitrogen gas is to be supplied from the gas introducing tube 37 at a flow rate of 10 L/min.

In such a substrate processing apparatus and manufacturing method of a semiconductor device, the sublimed and vaporized antimony oxide is not cooled as it reaches the surface by transferring inside the inner tube 23, and antimony oxide does not adhere to the inner surface of the inner tube as reaction products. Thus it is possible to supply the vapor of antimony oxide to the surface of the semiconductor substrate without fail. Meanwhile, as the sublimation heater 26 is prepared in the vicinity of the raw material in the reaction chamber, the temperature of the raw material sublimation portion 46 can be controlled without fail. Furthermore, as the heat insulation portion 36 is prepared between the raw material sublimation portion 46 and the substrate processing area, the influence of the main heater 22 on the temperature of the raw material sublimation portion 46 can be prevented. As the heating temperature of the sublimation heater 26 at the time when antimony oxide is diffused onto the surface of the semiconductor substrate is controlled at the sublimation temperature of antimony oxide or higher, it is possible to supply the vapor of antimony oxide to the surface of the semiconductor substrate more surely, even when the heat insulation portion 36 with a relatively low temperature is located before it reaches the substrate processing area. That is, the sublimation heater 26 is controlled in a range of temperature between 650° C. and 850° C., which is higher than the sublimation temperature 656° C. (775° C. in the example in FIG. 6). This is because it is preferable to control the sublimation heater 26 at a temperature higher than the sublimation temperature, as even when the raw material is sublimated, re-solidification of the raw material may occur in the portion of low temperature because the temperature in the side of the raw material sublimation portion 46 starting from the heat insulation portion is lowered due to the presence of the heat insulation portion 36 which is prepared in order to suppress the influence of the temperature of the substrate processing area on the raw material sublimation portion. The metal pollution caused by the heater element 28 can be prevented, as a susceptor is prepared on the upper surface of the base board 27.

It is not necessary to prepare the susceptor 29 when the pollution is not an issue.

The preferred embodiment was explained for the case in which the raw material is antimony oxide, however, the invention can be applied to cases in which other raw materials are used. Although the heating temperature of the main heater was set at 1200° C. when antimony oxide is diffused onto the surface of the semiconductor substrate, it is preferable to set the heating temperature of the main heater at 1150° C. or higher when the vapor of antimony oxide is supplied to the substrate.

In a substrate processing apparatus and method for manufacturing a semiconductor device according to the present invention, the vapor of the raw material can be supplied to the surface of the substrate without fail, as the vapor of the raw material is not cooled. The influence of the main heater on the temperature of the raw material sublimation portion can be prevented when a heat insulation portion is prepared between the substrate processing area and the raw material sublimation portion in the reaction chamber. When the heating temperature of the sublimation heater is set at over the sublimation temperature of the raw material, the vapor of the raw material can be supplied to the surface of the substrate more surely.

What is claimed is:

1. A substrate processing apparatus comprising:
   a boat on which a plurality of substrates are supported and which is located in a substrate processing area set in a reaction chamber;
   a main heater which heats the plurality of substrates in the reaction chamber, the main heater being located outside the reaction chamber;
   a sublimation heater located in the reaction chamber;
   a raw material sublimation portion on which a raw material is mounted and which is located in the reaction chamber; and
   a heat insulation portion located in the reaction chamber, wherein
   the sublimation heater is located in a vicinity of and below the raw material sublimation portion,
   at least while the raw material is sublimated by the sublimation heater and a sublimated material is supplied to a surface of the plurality of substrates, the heat insulation portion is located between the raw material sublimation portion and a substrate processing area and is located over the raw material and the sublimation heater without directly contacting the raw material and the sublimation heater,
   the raw material sublimated by the sublimation heater is caused to flow upward in a flowing direction to be supplied to the plurality of substrates, and
   the plurality of substrates are supported on the boat so as to be arranged in the flowing direction of the sublimated raw material, and also supported horizontally so that each surface is directed upward.

2. A substrate processing apparatus according to claim 1, wherein the heat insulation portion comprises a box shaped member in which a quarts wool is packed.

3. A substrate processing apparatus according to claim 1, wherein the heating temperature of the sublimation heater is set at a temperature over a sublimation temperature of the raw material.

4. A substrate processing apparatus according to claim 1, wherein after a temperature of said main heater reaches a temperature at which said substrate is processed, said main heater and sublimation heater are controlled so that a temperature of said sublimation heater reaches a temperature at which said raw material is sublimated.

5. A substrate processing apparatus according to claim 1, wherein when a temperature of said raw material reaches a temperature at which said raw material is sublimated, said main heater and sublimation heater are controlled so that a temperature of said substrate reaches a temperature at which said substrate is processed.

6. A substrate processing apparatus according to claim 1, wherein said sublimation heater comprises a base board and a heater element, and a susceptor for preventing metal contamination is mounted on an upper surface of said base board.

7. A substrate processing apparatus comprising:
   a boat on which a plurality of substrates are supported and which is located in a substrate processing area set in a reaction chamber;
   a main heater which heats the plurality of substrates in the reaction chamber, the main heater being located outside the reaction chamber;
   a sublimation heater located in the reaction chamber;
   a raw material sublimation portion on which a raw material is mounted and which is located in the reaction chamber; and
   a heat insulation portion which is located between the raw material sublimation portion and a substrate processing area in the reaction chamber, wherein
   the raw material sublimation portion is located below the substrate processing area.
   the sublimation heater is located in a vicinity of and below the raw material sublimation portion,
   a gas of the raw material sublimated by the sublimation heater flows past the outside of the heat insulation portion, from the raw material sublimation portion to the substrate processing area, and
   the plurality of substrates are supported on the boat so as to be arranged in a flowing direction of the sublimated raw material, and also supported horizontally so that each surface is directed upward.

8. The substrate processing apparatus according to claim 7, wherein the heat insulation portion is located over the raw material and the sublimation heater without directly contacting the raw material and the sublimation heater.

9. The substrate processing apparatus according to claim 7, wherein the heat insulation portion is located between the raw material sublimation portion and the substrate processing area, at least while a sublimated material is supplied to a surface of the substrate.

10. The substrate processing apparatus according to claim 7, wherein the heat insulation portion is located between the raw material sublimation portion and the substrate processing area and is located over the raw material and the sublimation heater without directly contacting the raw material and the sublimation heater, at least while a sublimated material is supplied to a surface of the substrate.

* * * * *